United States Patent [19]

Ahmed et al.

[11] Patent Number: 5,256,964
[45] Date of Patent: Oct. 26, 1993

[54] TESTER CALIBRATION VERIFICATION DEVICE

[75] Inventors: Imtiaz K. Ahmed, Pleasant Valley; Nitin B. Gupta, Hopewell Junction, both of N.Y.

[73] Assignee: International Business Machines Corporation, Armonk, N.Y.

[21] Appl. No.: 923,408

[22] Filed: Jul. 31, 1992

[51] Int. Cl.$^5$ .................................... G01R 31/28
[52] U.S. Cl. .................. 324/158 R; 324/73.1; 368/117; 371/15.1
[58] Field of Search .............. 324/158 R, 73.1, 617; 368/117, 118, 113–116; 371/15.1, 25.1, 16.1; 437/8; 364/481, 550

[56] References Cited

U.S. PATENT DOCUMENTS

| | | | |
|---|---|---|---|
| 3,671,693 | 8/1972 | Hsueh | 324/188 |
| 3,781,670 | 12/1973 | McMahon | 324/57 R |
| 4,382,105 | 7/1983 | McLeod | 324/57 DE |
| 4,489,272 | 12/1984 | McLeod | 324/73.1 |
| 4,688,947 | 8/1987 | Blaes et al. | 368/120 |
| 4,866,685 | 9/1989 | Lee | 368/117 |
| 5,003,256 | 3/1991 | Merrill | 324/158 R |
| 5,099,196 | 3/1992 | Longwell et al. | 324/73.1 |

Primary Examiner—Vinh Nguyen
Attorney, Agent, or Firm—Henri D. Schnurmann

[57] ABSTRACT

A circuit for verifying the accuracy a tester, for enhancing its calibration and for providing tracking between testers. The circuit includes a delay element, first and second multiplexers connected to the input and output of the delay element, respectively, and a feedback path linking outputs of the second multiplexer to inputs of the first multiplexer to provide an oscillation. The delay between an input of the first multiplexer to an output of the second multiplexer is measured and this delay is compared to the frequency domain measurement of the same to provide an indication of the accuracy of the tester.

12 Claims, 3 Drawing Sheets

FIG. 3A
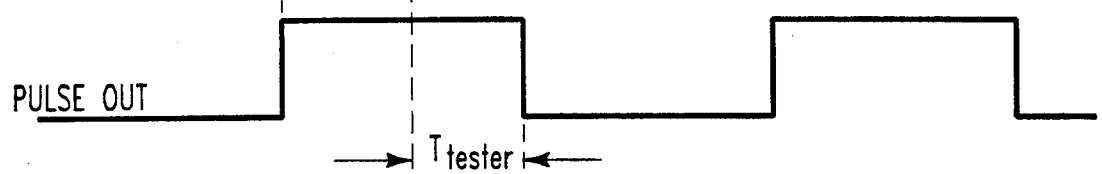
FIG. 3B
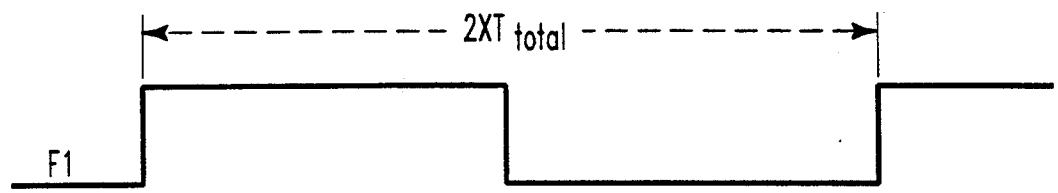
FIG. 3C
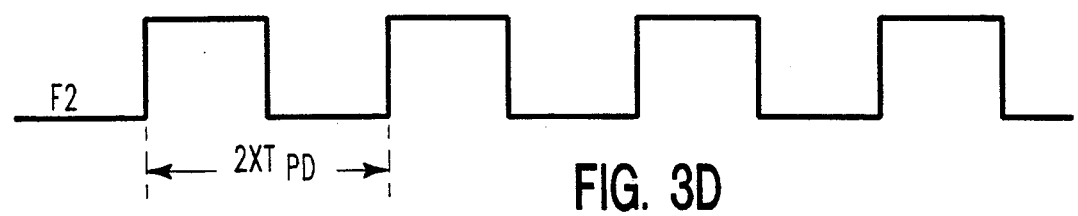
FIG. 3D
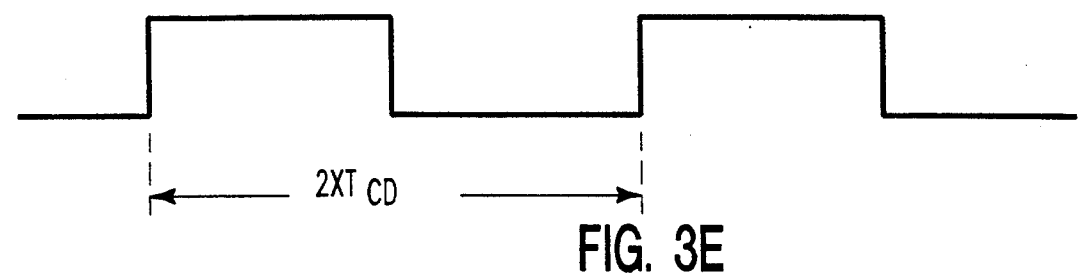
FIG. 3E
FIG. 3

TESTER CALIBRATION VERIFICATION DEVICE

FIELD OF THE INVENTION

This invention relates to a method and apparatus for verifying the accuracy of a test system. More particularly, in a preferred embodiment, this invention relates to the evaluation of test systems, to the enhancement of the process of tester calibration, and to tracking between test systems.

BACKGROUND OF THE INVENTION

Current methodology for determining the accuracy of a tester involves time consuming and manually intensive oscilloscope measurements. Alternatively, calibration verification programs have been written, but they are of limited use since they must be customized for each tester and modified for each part-number.

An important consideration for any tester is its ability to reproduce measurements over long periods of time. This requires calibrating a tester prior to its use and recalibrating it on an ongoing basis. This procedure is particularly advantageous for aligning signals generated at various tester channels and inputted to a Device under Test (DUT). Failure to do so has a negative impact on subsequent measurements, in particular to those pertaining to AC testing, wherein the relative positioning of signals with respect to each other is of prime importance. Moreover, signals generated at an input channel routinely require their being compared with signals outputted by the DUT. Uncalibrated channels, however, may distort this comparison and give imprecise measurements.

Environmental factors, such as variations in temperature, humidity, etc., cause measurements to drift, another source of inaccuracy, even after having completed the calibration of a tester. Measurements taken between long time intervals can be distorted and invalidate test data gathered during that time. It is therefore essential to provide a way for periodically resetting the tester to compensate for drift, even if remaining within performance specifications. A standard method for tracking a tester subject to drift is by using a "golden card", specifically designed for this purpose and customized for a given tester. Those skilled in the art will readily appreciate that such a technique is restrictive by nature and lacks the important characteristic of portability between test systems.

AC testing routinely requires characterizing turn-on ($t_{on}$) and turn-off ($t_{off}$) delays, or any combination thereof. More particularly, for signals outputted from a DUT, the slope of the rise time or fall time of a signal, hereinafter referred to as slew rate, assumes great importance, since tester comparators are sensitive to slew rates which, in turn, impact the precision of delay measurements.

During the process of conducting manufacturing tests, or while characterizing IC chips and the like, it is important to correlate results from one test system to those of another. Practical considerations oftentimes require that part numbers of a same technology be tested on more than one test system. Thus, correlation between one test system and another is an essential requirement. Measurements originating from a variety of testers usually bear the imprint of the tester and affect the accuracy of the measurements.

Practitioners of the art will readily appreciate that the process of calibrating testers would be greatly enhanced if comparisons between signals could be made tester independent. Comparisons, even under normal circumstances, are difficult at best and oftentimes meaningless, since each tester has its own personality. If tester independent readings could be achieved, portability from one tester to the next would ensue, a distinct and substantial advantage over the present state of the art. The process of calibrating is further complicated when testing a semiconductor wafer in which the proximity of I/O terminal pads precludes actual probing.

Standard techniques for aligning signals normally require the use of TDR (Time Domain Reflectometry), which consists of sending a signal through an open ended medium, e.g., a coaxial cable, obtaining the reflected signal and measuring the time difference, normally twice the delay path. This technique is taught by Lee in U.S. Pat. No. 4,866,685, wherein testing a board is achieved by transmitting a test signal to the board via a transmission line and analyzing each response signal returned from the board in response to the original test signal.

The path delay obtained when using TDR depends on the slew rate of a driver. (A driver is normally connected to an output terminal of a chip and normally reshapes the waveform of the DUT output signal.) During calibration, the path delay from the DUT output to the comparator of the tester is determined by using this method. This technique works properly provided the slew rate of the TDR signal and the DUT output driver signals are identical. However, they oftentimes differ considerably from each other, which may cause a significant error in the measurement. A second basic problem with TDR also exists, in that signals with fast rise time propagating through a board have their rise time significantly altered, thereby giving inaccurate and erroneous readings. Thus, the delay obtained by TDR may be inaccurate due to differences in driver slew rates between the TDR and the DUT.

OBJECTS AND SUMMARY OF THE INVENTION

Accordingly, an object of the invention is to provide a method and apparatus for verifying the accuracy of a tester and achieve tracking between any semiconductor wafer or high level package testers.

Another object of the invention is to enhance calibration of a tester with a universal device which is part number and tester independent.

A further object is to determine chip path delay with great accuracy by performing measurements in the frequency domain.

Yet another object is to provide a method for determining the magnitude of tester drift.

Still another object is to track test systems by correlating time domain measurements with measurements in the frequency domain.

A more particular object is to provide a device with a variety of drivers with different slew rates or with programmable slew rates.

In order to achieve the above objects according to present invention, there is provided a device (or chip) for verifying the accuracy of a test system, the test system having inputs and outputs for receiving and generating signals, respectively, the device (or chip) comprising: delay means provided with one input and one output; first selector means having a plurality of inputs and one output, the inputs adapted for connection with the test system outputs for receiving signals generated by the test system and the output is connected to the input of the delay means; second selector means having a plurality of outputs and one input, the input is connected to the output of the delay means and the outputs are adapted for connection with the test system inputs to provide signals to the test system; and means for linking one of the outputs of the second selector means to one input of the first selector means, the linking means thereby providing a feedback path to enable an oscillation, wherein the measurement of a time delay between a signal generated by the test system and received by the first selector means and the signal at the output of the second selector means when compared to a frequency domain measurement of the same, provides an indication of the accuracy of the test system.

The foregoing and other objectives, features and advantages of the present invention will become apparent from the detailed description of the preferred embodiment of the invention, as illustrated in the accompanying figures.

BRIEF DESCRIPTION OF THE DRAWINGS

FIGS. 3A-3E shows timing diagrams of various signals in and out of the tester and of the verification device.

DETAILED DESCRIPTION OF THE INVENTION

Figure 1:
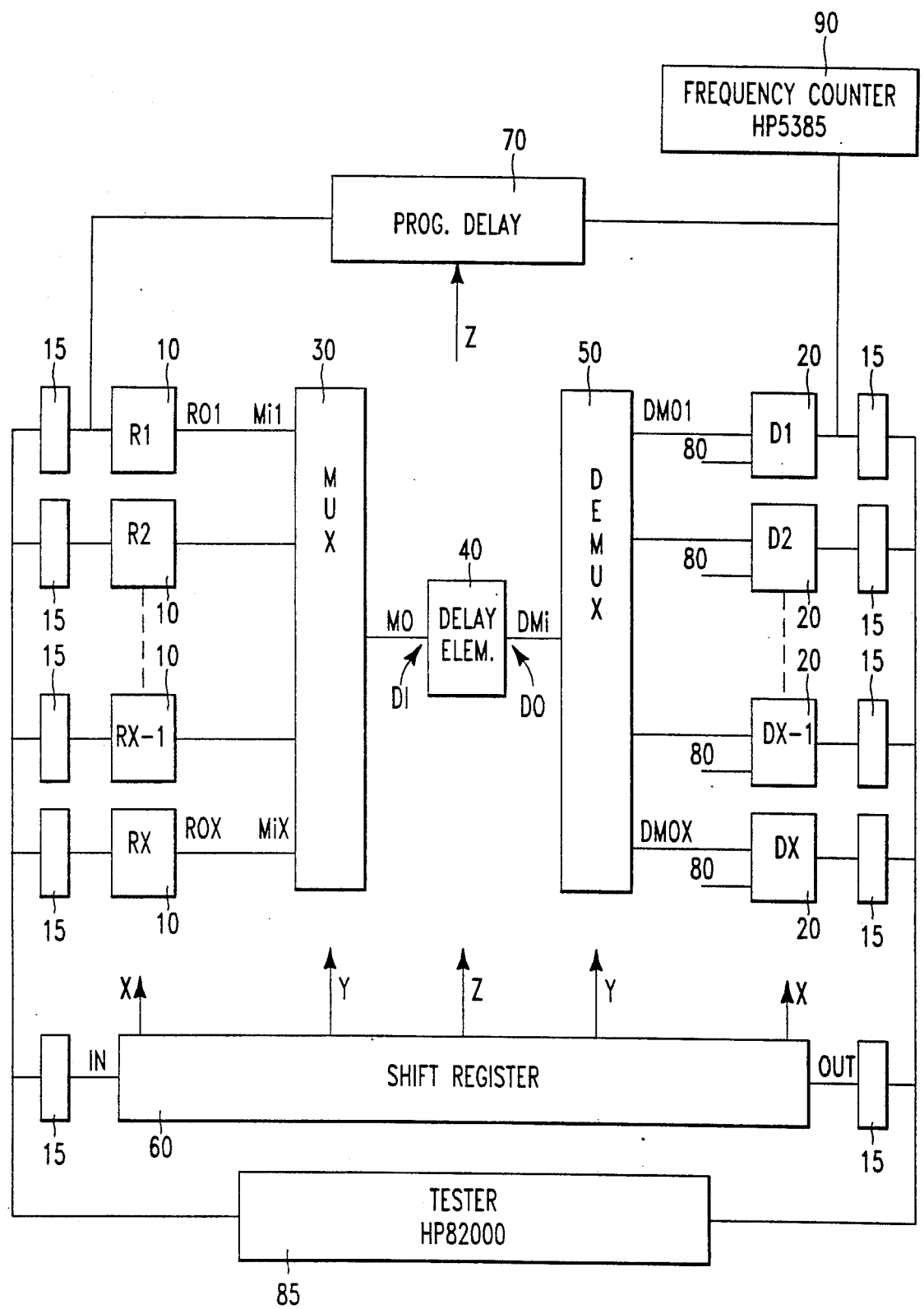
FIG. 1 is a schematic diagram of a tester and technology independent verification device for verifying the accuracy of a tester and for enhancing its calibration verification process.

Referring to FIG. 1, a schematic diagram of a preferred embodiment of a tester and technology independent verification (chip or) device 1 to verify the accuracy of a tester and for enhancing its calibration process is shown. The tester verification device 1 is comprised of a plurality of chip receiver circuits 10, ($R_1, \ldots, R_x$), and of chip driver circuits 20, ($D_1, \ldots, D_x$). Each receiver circuit 10 and each driver circuit 20 is connected to one tester verification device I/O terminal 15. Inputs of the chip receivers 10 are stimulated from the tester drivers (not shown). The output ($R_{01}, \ldots, R_{0x}$) of each receiver circuit 10 is connected to, respectively, one input of multiplexer 30 ($M_{i1}, \ldots, M_{ix}$). The output of the multiplexer 30 is in turn attached to the input of delay element 40. The output $D_o$ of the delay element 40 is connected to the input $DM_i$ of demultiplexer 50. The outputs ($DM_{01}, \ldots, DM_{0x}$) of demultiplexer 50 are attached, respectively, to the inputs ($D_{01}, \ldots D_{0x}$) of the drivers 20. The outputs of the circuits 20 ($D_1, \ldots, D_x$) are connected to the tester comparators (not shown).

A shift register 60, used to minimize external control signals, is connected to the receiver circuits 10, to the multiplexers 30 and 50, and to the drivers circuits 20 via control lines providing signals X and Y, respectively. Shift register 60 has a length that is dependent on the number of driver and receiver circuits 10 and 20, respectively, and of the length of each of the two multiplexers 30 and 50. Practitioners of the art will readily appreciate that three separate shift register of length equal to the number of receivers 10, of the multiplexers, and of the number of drivers 20, respectively could have been used instead, or in any combination thereof. Inputs to the shift register 60 are provided by the tester itself or, alternatively, by any external source. One of the chip I/O terminals connected to the output of driver circuits 20 is connected to one of the chip I/O terminals connected to the input of a receiver circuit 10, thereby establishing a feedback loop and thus forming a ring oscillator. A programmable delay 70 can, optionally, be included in the feedback path to vary the period of oscillation of the ring oscillator, thereby enabling the effects of cycle time to be characterized. This variable programmable delay is controlled by a signal Z generated by the shift register 60.

The chip receiver circuits 10 and driver circuits 20 shown in FIG. 1 as independent circuits can, alternatively, be advantageously implemented using bidirectional drivers. These can be programmed by a control signal provided by shift register 60 to have them behave either as a driver for sending signals or as a receiver for receiving signals. For simplicity sake, however, FIG. 1 shows drivers and receivers as separate circuits, with their own respective inputs and outputs.

The operation of chip 1 for determining the AC accuracy of the test system is as follows:

First, if on-chip bidirectional drivers are used, they are programmed to match a predetermined application, i.e., they are selected either as drivers or as receivers, using control signal X from shift register 60. The slew rate of any driver circuit 20 is controlled by control line 80 and can be adjusted to any predetermined slew rate to match the particular technology being tested. The tester drivers (not shown) are connected to the inputs of receiver circuits 10 ($R_1, \ldots, R_x$) and the tester comparators (not shown) are attached to the outputs of drivers circuits 20 ($D_1, \ldots, D_x$). Control signal Y generated by the shift register 60 is used for selecting any input/output combination. A delay, measured from any input to any output of a selected path ($T_{tester}$), is obtained by sending a signal from the tester driver (not shown) alongside the selected path and detecting the presence of the outputted signal at the tester comparator (not shown). This measurement shall be henceforth referred to as pulse-in to pulse-out measurement. Other pulse-in to pulse-out measurements are made in a similar manner for all desired input/output combinations. Practitioners of the art will readily appreciate that a measurement may be achieved with a variety of test equipment, an example of which is Hewlett Packard HP82000 tester 85.

The on-chip path delay $T_{CD}$ can be accurately measured in the frequency domain, as described below.

Control signal Z from shift register 60 is first used to enable the loop that includes the programmable delay 70 and the selected input/output path to oscillate. Its frequency $F_1$ is measured at the output of the chip driver circuit 20 to determine $T_{total}$. Subsequently, the control signal Z from shift register 60 enables the loop that includes only the variable programmable delay to oscillate. This frequency $F_2$ is measured at the output of the chip driver circuit 20 to determine the programmable delay $T_{PD}$. The combination $T_{total}$ of the on-chip path delay and the programmable delay is related to $F_1$ and $F_2$ by equation (1):

$$T_{total} = T_{PD} + T_{CD} = (0.5)(1/F_1) \tag{1}$$

$$T_{PD} = (0.5)(1/F_2)$$

$$T_{CD} = T_{total} - T_{PD}$$

wherein:

$T_{PD}$ = Programmable delay, and
$T_{CD}$ = On chip path delay

Measurements in the frequency domain can be made with a variety of frequency counters, such as a Hewlett Packard HP538590.

The worst case difference between the tester measurement ($T_{tester}$) and the on-chip path delay ($T_{CD}$) is the overall tester accuracy.

Operation of the device for tester channel to channel skews is as follows:

Shift register 60 selects each input (one at a time) and any output, and tester measurements are made for each combination. The difference between the measurement with respect to one input/output combination represents the tester driver skews. Likewise, tester comparator skews can be made by taking measurements between one tester drivers to all tester comparators, taken one at a time.

ENHANCEMENT OF THE TEST SYSTEM ACCURACY

Recent advances in semiconductor technology have imposed stringent requirements on the overall accuracy of the AC test system. Tester comparators are sensitive to the slew rate of the incoming signals. Hence, the slew rate is a significant component of the overall tester accuracy. Tester calibration is achieved by judicious use of the previously mentioned TDR technique. Since the TDR and DUT driver slew rates normally differ from each other, this difference, usually, has a significant impact on tester measurements.

The difference between the tester measurement ($T_{tester}$) and the on-chip path delay measurement ($T_{CD}$) obtained from the frequency domain can be used to offset tester calibration tables to improve tester accuracy.

Following, is a method for enhancing the tester accuracy. As previously mentioned, driver skews are first determined. Differences between channels can be used to align all the drivers by adding appropriate offsets to the calibration tables. Similarly, tester comparators can also be de-skewed. Since the drivers and receivers are now properly aligned, a tester measurement ($T_{tester}$) is made between an input and an output. This is compared to the on-chip path delay ($T_{CD}$) as obtained from the frequency measurement. The difference contains the effect of slew rate and can be added to the tester calibration tables to compensate for its effect.

Tester measurements can be made at different cycle times. Similar results can be achieved in the frequency domain by varying the programmable delay 70.

In instances where it is feasible to probe, on-chip path delay can be obtained from an oscilloscope. However, this could introduce inaccuracies due to probe loading effects.

Figure 2:
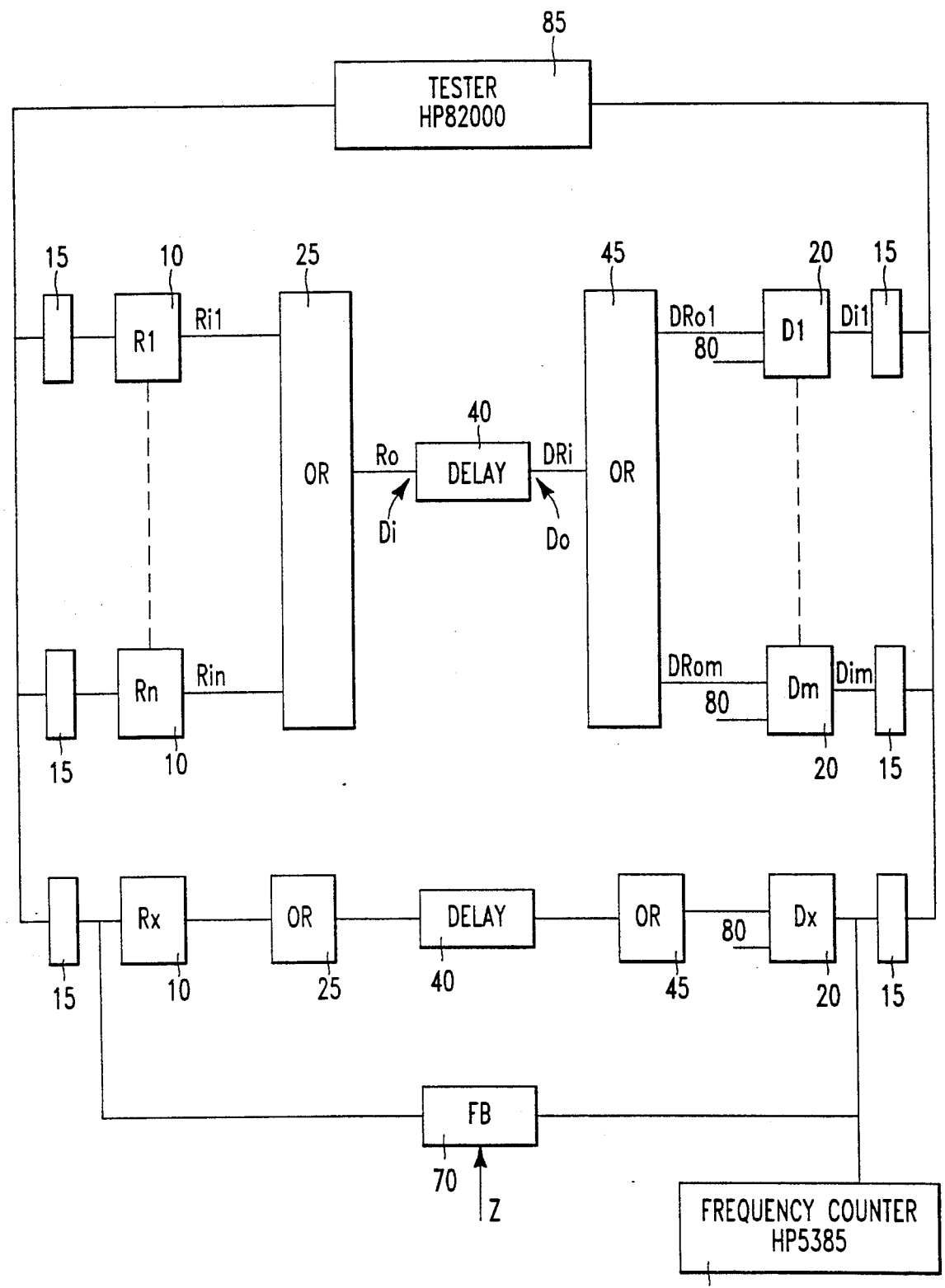
FIG. 2 is a second embodiment of circuitry used for tester calibration.

Referring now to FIG. 2, it is shown a schematic diagram of a second embodiment of test circuitry in accordance with the present invention.

The test circuitry shown comprises a plurality of n inputs and m outputs. The inputs of the chip receivers 10 ($R_1, \ldots, R_n$) receive their stimulus from the tester drivers (not shown). The outputs of the chip receivers 10 ($R_{01}, \ldots, R_{0n}$) are connected to the inputs ($R_{i1}, \ldots, R_{in}$) of an OR gate 25. Its output $R_0$ is in turn connected to the input $D_1$ of a delay element 40. The output $D_0$ of delay 40 is attached to the input $DR_i$ of an OR gate 45. The outputs ($DR_{01}, \ldots, DR_{0m}$) of the OR gate 45 are in turn connected to the inputs of the chip drivers 20 ($D_{R01}, \ldots, DR_{0m}$), and finally the outputs of drivers 20 ($D_{i1}, \ldots, D_{im}$) are attached to the tester comparators (not shown). The slew rate of drivers 20 can be adjusted to any predetermined slew rate using control line 80 so as to provide the best match to the particular technology being tested.

A path with the same elements as described above is shown, wherein the output of a driver feeds back into the input of a receiver, thus forming a ring oscillator dedicated to measuring the frequency. A control signal Z, provided by the tester or by any other external means can be used to enable/ disable the feedback path.

The design of the tester verification chip is such that the delay through any input/output pair combination be identical to each other.

Generally, any measurement can be made from any tester input to any tester output. Furthermore, inputs and outputs can also be interchanged, thereby making the design totally reversible and symmetric about itself. Additionally, the path delay can be calculated using frequency measurements instead of time domain measurements, as was explained previously.

Referring now to FIGS. 3A-3E showing timing diagrams of various signals in and out the tester and of the tester verification device 1.

FIG. 3A is a signal outputted by the tester into the device input, previously referred to as pulse-in. FIG. 3B is a signal outputted by the device and inputted into the tester comparator, previously referred to as pulse-out. The on-chip delay measurement by the tester ($t_{tester}$) is the time difference between either the rise or fall times of the edges of the signals shown in FIGS. 3A and FIG. 3B.

FIGS. 3C, 3D, and 3E show several waveforms representing measurements in the time domain. FIG. 3C shows the frequency F1, which is equivalent in the time domain to twice the total path delay between the input and output of the device including the programmable delay. FIG. 3D shows the frequency F2, the equivalent in the time domain of twice the programmable delay ($2 \times T_{PD}$). FIG. 3E shows the difference between the waveforms of FIG. 3C and 3D, equivalent in the time domain to twice the delay from input to output of the device ($T_{CD}$).

It is understood that while this invention has been described in connection with several examples thereof, that other modifications and variations will be contemplated by one skilled in the art upon the study of the specification, drawings and following claims. It is intended therefore, that the invention not be limited solely to the described embodiments. Various modifications and variations are contemplated and can be made without departing from the scope and spirit of the invention, as hereinafter defined by the appended claims.

What is claimed is:

1. A device for verifying the accuracy of a test system, the test system having inputs and outputs for receiving and generating electrical signals, respectively, said device comprising:
    delay means provided with one input and one output;
    first selector means having a plurality of inputs and one output, said inputs adapted for connection with said test system inputs for receiving signals generated by the test system and said output is connected to said input of said delay means;
    second selector means having a plurality of outputs and one input, said input is connected to said output of said delay means and said outputs are adapted for connection with said test system inputs to provide signals to the test system; and means for linking one of said outputs of said second selector means to one input of said first selector means, said linking means thereby providing a feedback path to enable an oscillation, wherein the measurement of a time delay between a signal generated by the test system and received by said first selector means and the signal at the output of said second selector means when compared to a frequency domain measurement of the same, provides an indication of the accuracy of said test system.

2. The circuit as recited in claim 1, wherein said linking means includes a programmable delay.

3. The circuit as recited in claim 1, further comprising shift register means for providing control signals to said first and second selector means.

4. The circuit as recited in claim 1, further comprising receiver circuits responsive to signals generated by the test system for driving said first selector means, each of said receiver circuits having an output respectively connected to one of said inputs of said first selector means.

5. The circuit as recited in claim 1, further comprising driver circuits for driving signals into the test system, each of said driver circuits having an input respectively connected to one of said outputs of said second selector means.

6. The circuit as recited in claim 5, wherein at least one of said driver circuits is programmed to have its slew rate adjusted to a predetermined slew rate.

7. The circuit as recited in claim 1, further comprising receiver circuits responsive to signals generated by the test system for driving said first selector means, each of said receiver circuits having an output respectively connected to an input of said first selector means and still further comprising driver circuits for driving signals into the test system, each of said driver circuits having an input respectively connected to an output of said second selector means.

8. The circuit as recited in claim 7, wherein said driver and said receiver circuits are combined in a single bi-directional driver circuit.

9. The circuit as recited in claim 1, wherein said first and second selector means each comprise a multiplexer, respectively.

10. The circuit as recited in claim 9, wherein said said first multiplexer means comprises an n-to-1 multiplexer, and wherein said second selector means comprises a 1-to-n demultiplexer.

11. A method for verifying the accuracy of a tester having a plurality of input terminals and a plurality of output terminals, said method comprising the steps of:
 a) providing a delay element characterized by a predetermined delay and having an input terminal and an output terminal;
 b) selecting a tester output terminal from the plurality of tester output terminals and connecting the selected tester output terminal, having an output signal thereon, to the input terminal of the delay element;
 c) selecting an input terminal from the plurality of tester input terminals and connecting the selected tester input terminal to the output terminal of the delay element for providing an input signal thereon;
 d) measuring the time delay between signals on the selected tester input terminal and the selected tester output terminal through the delay element, the time delay measurement being in the time domain;
 e) linking the selected output terminal of the tester to the selected input terminal of the tester to provide a feedback path and obtain an oscillation;
 f) measuring the frequency of oscillation of a path through the delay element between the selected tester input terminal and the selected tester output terminal and including the feedback path;
 g) measuring the frequency of oscillation provided by the feedback path by itself;
 h) adjusting the frequency measurement provided by steps f) and g) to obtain a frequency measurement independent of the feedback path; and
 i) comparing the measurement in the time domain to half of the inverse of the adjusted frequency measurement provided by step h), the comparison being indicative of the tester accuracy.

12. A method for verifying the accuracy of a tester at different cycle times having a plurality of input terminals and a plurality of output terminals, said method comprising the steps of:
 a) providing a delay element characterized by a predetermined delay and having an input terminal and an output terminal;
 b) selecting a tester output terminal from the plurality of tester output terminals and connecting the selected tester output terminal, having an output signal thereon, to the input terminal of the delay element;
 c) selecting an input terminal from the plurality of tester input terminals and connecting the selected tester input terminal to the output terminal of the delay element for providing an input signal thereon;
 d) measuring the time delay between signals on the selected tester input terminal and the selected tester output terminal through the delay element, the time delay measurement being in the time domain;
 e) linking the selected output terminal of the tester to the selected input terminal of the tester through a variable programmable delay to provide a feedback path and obtain an oscillation;
 f) measuring the frequency of oscillation of a path through the delay element between the selected tester input terminal and the selected tester output terminal and including the variable programmable delay feedback path;
 g) measuring the frequency of oscillation provided by the feedback path that includes the variable programmable delay by itself;
 h) adjusting the frequency measurement provided by steps f) and g) to obtain a frequency measurement independent of the feedback path that includes the variable programmable delay; and
 i) comparing the measurement in the time domain to half of the inverse of the adjusted frequency measurement provided by step h), the comparison being indicative of the tester accuracy.

* * * * *

UNITED STATES PATENT AND TRADEMARK OFFICE
CERTIFICATE OF CORRECTION

PATENT NO. : 5,256,964
DATED : October 26, 1993
INVENTOR(S) : Imtiaz K. Ahmed and Nitin B. Gupte It is certified that error appears in the above-identified patent and that said Letters Patent is hereby corrected as shown below:

Title Page, Column 1:   Item 75:  Inventors:

Delete:   Nitin B. Gupta

Add:   --Nitin B. Gupte--

Signed and Sealed this

Fifth Day of July, 1994

Attest:

BRUCE LEHMAN

*Attesting Officer*   *Commissioner of Patents and Trademarks*